US011556149B2

(12) United States Patent
Odell Boice et al.

(10) Patent No.: US 11,556,149 B2
(45) Date of Patent: Jan. 17, 2023

(54) SYSTEMS AND METHODS OF FORMING A VIDEO DISPLAY

(71) Applicant: Dell Products, LP, Round Rock, TX (US)

(72) Inventors: Dan Odell Boice, Taipei (TW); Yu-Lung Lin, Chungli (TW); Yi-Fan Wang, Taipei (TW); Chao-Kai Huang, Taipei County (TW)

(73) Assignee: Dell Products, LP, Round Rock, TX (US)

( * ) Notice: Subject to any disclaimer, the term of this patent is extended or adjusted under 35 U.S.C. 154(b) by 368 days.

(21) Appl. No.: 16/927,480

(22) Filed: Jul. 13, 2020

(65) Prior Publication Data

US 2022/0011818 A1     Jan. 13, 2022

(51) Int. Cl.
*G06F 1/16*      (2006.01)
*H01L 51/52*     (2006.01)
(Continued)

(52) U.S. Cl.
CPC ........ *G06F 1/1637* (2013.01); *H01L 51/5237* (2013.01); *H05K 1/147* (2013.01); *H05K 1/189* (2013.01); *G06F 1/203* (2013.01); *H05K 2201/056* (2013.01); *H05K 2201/10128* (2013.01)

(58) Field of Classification Search
CPC ......... H05K 2201/10128; H05K 1/147; H05K 1/189; H05K 2201/056; H05K 2201/10136; H05K 1/0203; H05K 2201/049; H05K 1/141; H05K 1/142; H05K 1/148; H05K 1/18; H05K 2201/042; H05K 5/03; H05K 9/0096; G06F 1/1637; G06F 1/1626;
(Continued)

(56) References Cited

U.S. PATENT DOCUMENTS

| 2009/0219227 A1* | 9/2009 | Takayama | ................ H01J 11/12 345/60 |
| 2013/0141866 A1* | 6/2013 | Refai-Ahmed | ..... H01L 23/3672 361/679.54 |

(Continued)

OTHER PUBLICATIONS

Liu C; CN-108230941-A (Year: 2018).*
Cao Z; EP-3557372-A1 (Year: 2019).*

*Primary Examiner* — Michael A Matey
(74) *Attorney, Agent, or Firm* — Prol Intellectual Property Law, PLLC; H. Kenneth Prol

(57) ABSTRACT

An information handling system may include an organic light-emitting diode (OLED) display layer of a video display to display an image to a user; an A-cover forming a housing behind the OLED display layer; and a physically bifurcated display daughter board between the OLED display layer and the A-cover, the physically bifurcated display daughter board including: a first portion of the display daughter board including a source driver integrated circuit (IC) operatively coupled to a processor to receive graphics data; and a second portion of the display daughter board comprising a power management integrated circuit (PMIC) operatively coupled to the first portion and a power source; the second portion of the display daughter board being mechanically coupled to an interior surface of the A-cover to dissipate heat away from the OLED display layer.

20 Claims, 6 Drawing Sheets

(51) Int. Cl.
*H05K 1/14* (2006.01)
*H05K 1/18* (2006.01)
*G06F 1/20* (2006.01)

(58) Field of Classification Search
CPC .......... G06F 1/1684; G06F 1/20; G06F 1/203; H01L 2251/5338; H01L 51/5237
See application file for complete search history.

(56) References Cited

U.S. PATENT DOCUMENTS

| | | | |
|---|---|---|---|
| 2015/0173176 A1* | 6/2015 | Lee | H05K 9/0096 |
| | | | 361/749 |
| 2015/0261265 A1* | 9/2015 | Dean | G01R 31/2891 |
| | | | 361/679.46 |
| 2015/0261266 A1* | 9/2015 | Dean | H05K 7/20 |
| | | | 361/679.46 |
| 2017/0358847 A1* | 12/2017 | Cho | H05K 1/0218 |
| 2019/0019855 A1* | 1/2019 | Park | G02F 1/13338 |
| 2020/0042125 A1* | 2/2020 | Lee | G06F 3/04883 |
| 2020/0042133 A1* | 2/2020 | Park | H01L 33/62 |
| 2020/0053868 A1* | 2/2020 | Park | H05K 1/0213 |
| 2020/0058712 A1* | 2/2020 | Lee | H01L 27/323 |
| 2020/0233458 A1* | 7/2020 | We | G06F 1/1684 |
| 2020/0267838 A1* | 8/2020 | An | H04M 1/0277 |
| 2020/0272198 A1* | 8/2020 | Ju | H04M 1/72403 |
| 2020/0356143 A1* | 11/2020 | Oh | G06F 1/203 |

* cited by examiner

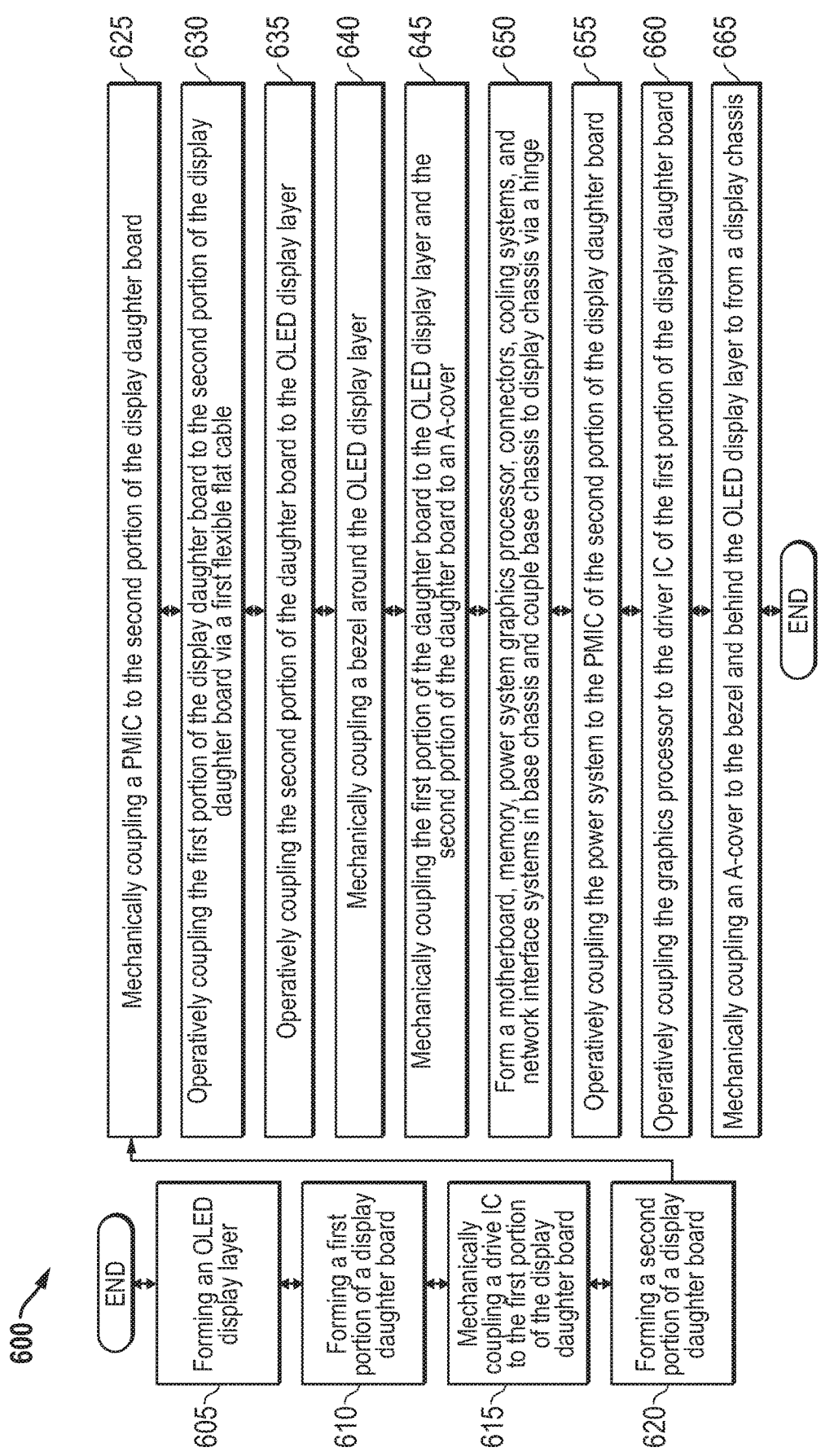

SYSTEMS AND METHODS OF FORMING A VIDEO DISPLAY

FIELD OF THE DISCLOSURE

The present disclosure generally relates to video displays. The present disclosure more specifically relates to heat management related to integrated circuits associated with video displays.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Further, the information handling system may include a video display that presents image, text, or other visual information to a user.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIG. 6 is a flow diagram illustrating a method of manufacturing a video display according to an embodiment of the present disclosure.

The use of the same reference symbols in different drawings may indicate similar or identical items.

DETAILED DESCRIPTION OF THE DRAWINGS

Figure 1:
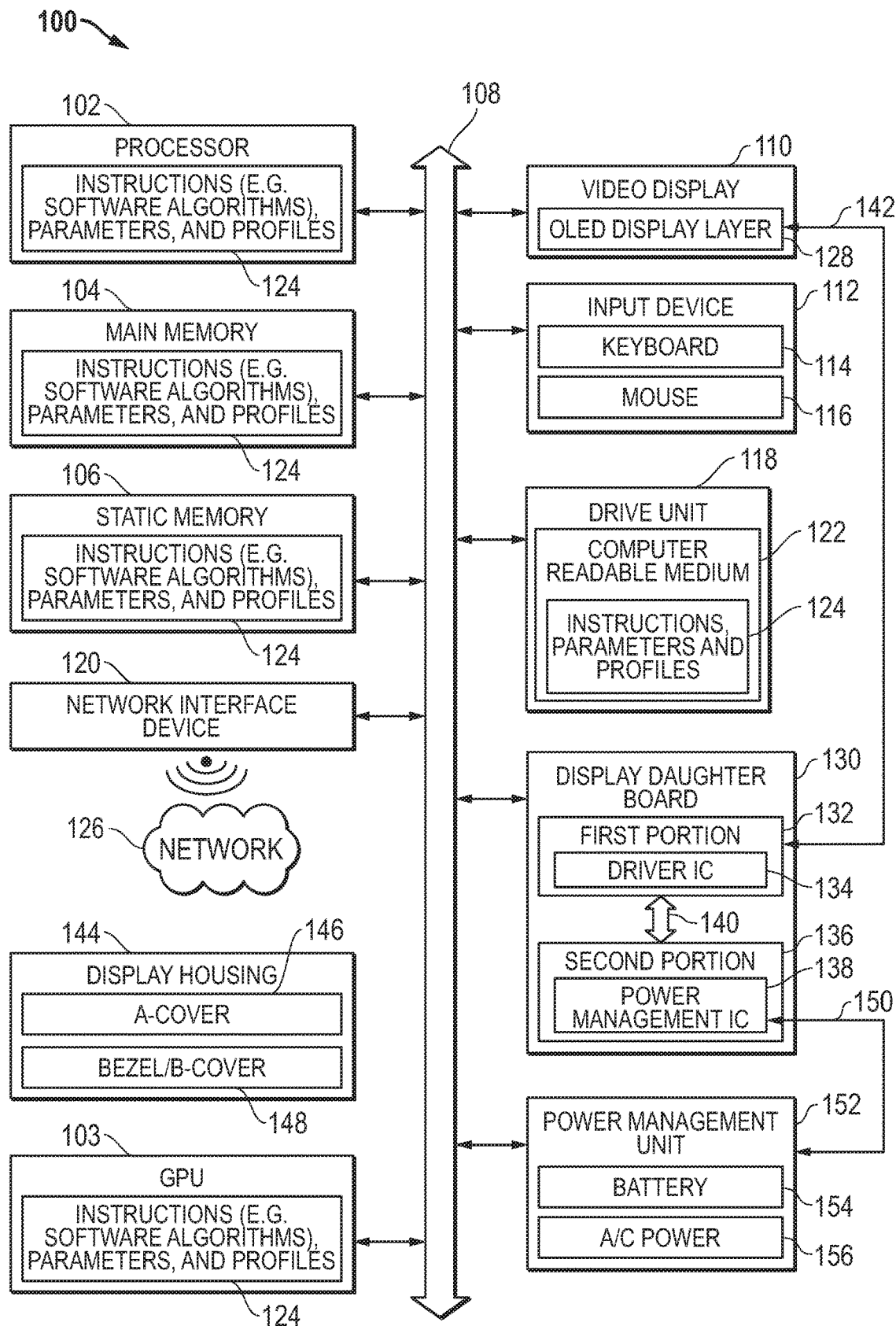
FIG. 1 is a block diagram illustrating an information handling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Embodiments of the present disclosure provide for a video display that includes circuitry that prevents heat from accumulating at any given location along the front or back surface of the display layer of the video display. Some display device technologies may be degraded when heat is applied to the display layer of the video display. Such display device technologies include organic light-emitting diode (OLED) display devices that, over a lifetime of the OLED video display, may have image sticking and degradation of the image as temperatures around the OLED video display increase. Although the present specification describes the video display as including an OLED display layer, the present specification contemplates that the methods and systems described herein may be applied to other types of display device technologies without going beyond the scope of the principles described herein.

A potential source of heat that may be applied to the OLED display layer is the power integrated circuit (IC). The power IC may be formed on a display daughter board that includes a printed circuit board comprising other circuitry used to drive the image at the OLED display layer. However, the power IC may generate temperatures higher than those temperatures under which the OLED display layer should operate and, thereby, may cause image sticking or degradation of that OLED display layer. In order to prevent the heat from the power IC or other heat sources associated with the display daughter board, the display daughter board may be placed below the OLED display layer. However, this placement of the display daughter board below the OLED display layer increases the width of a bezel used to cover the display daughter board and power IC as well as serve as a border around the OLED display layer and forming part of a B-cover of the display device. This "flat type" orientation of the display daughter board relative to the OLED display layer limits, at least, the bottom side border of the bezel to a form factor that prevents the reduction of the bottom side of the bezel.

In some embodiments, the width of the bezel may be decreased by placing the display daughter board behind the OLED display layer in a "bent type" configuration. In the embodiments described herein, the display daughter board may be physically bifurcated into a first portion and a second portion. The first portion may be communicatively and operatively coupled to the OLED display layer via a first flexible flat cable. The second portion of the display daughter board may be communicatively and operatively coupled to the first portion of the display daughter board via a second flexible flat cable. In these embodiments, the power IC may be placed on the second portion of the display daughter board while the second portion of the display daughter board is placed at a location between the OLED display layer and an A-Cover serving as part of the housing of the display device of an information handling system. In some embodiments described herein, the information handling system may be a laptop-type information handling system that includes a display housing and a base housing with the display housing and base housing coupled to each other via a hinge. In other embodiments, the information handling system may be a single tablet type computing system, smartphone, dual hinged tablet information handling system or the like. In some such embodiments, the information handling system may comprise a single display housing or multiple display housings that also house other components of the information handling system. The display housing includes the A-cover and a B-cover. The A-cover may be any cover made of, for example, metal that covers a back portion of the lid chassis. The B-cover may be any or a combination of a bezel and the OLED display that covers a front portion of the display housing. The base housing may include a C-cover and D-cover. The C-cover may house a keyboard and touchpad, among other components of the information handling system. The D-cover may serve as a cover that, with the C-cover, houses other components of the information handling system such as a memory, a processor, a network interface device, a fan and/or heat sink, a drive unit, a power management unit, a battery, a graphical processing unit (GPU), and a network interface device, among other components of the information handling system.

In an embodiment, the second portion of the display daughter board in the display housing chassis of the information handling system may be placed against a back side of the OLED display layer such that heat produced by the power IC may be dissipated to a space between the OLED display layer and the A-cover as well as through the A-cover and across a relatively larger surface of the OLED display layer. In another embodiment, the second portion of the display daughter board may be mechanically coupled to the A-cover so that heat form the power IC is dissipated to a space between the OLED display layer and to the A-cover. In this embodiment, the A-cover may be made of a heat conductive material such as a metal that receives heat from the power IC and dissipates it out the back side of the A-cover and away from the OLED display layer.

The present specification describes a video display including an organic light-emitting diode (OLED) display layer to display an image to a user, an A-cover forming a housing behind the OLED display layer, and a physically bifurcated display daughter board between the OLED display layer and the A-cover, the physically bifurcated display daughter board including: a first portion of the display daughter board including a source driver integrated circuit (IC) and a second portion of the display daughter board comprising a power management integrated circuit (PMIC) with the second portion of the display daughter board being mechanically coupled to an interior surface of the A-cover to dissipate heat away from the OLED display layer. In some embodiments, the first portion of the display daughter board is mechanically coupled to a back surface of the OLED display layer. The first portion of the display daughter board and the second portion of the display daughter board are electrically and communicatively coupled via a flexible flat cable (FFC). The information handling system, in some embodiments, may include a bezel cover formed around the OLED display layer as part of the B-cover of the video display, the bezel comprising a four-sided narrow border around the edges of the OLED display layer. In these embodiments, the width of the bezel along each side may be equal to each other.

In some embodiments, the first portion of the display daughter board is electrically coupled to the OLED display layer via a flexible flat cable in a bent-type configuration. In some embodiments, this may allow the second portion of the display daughter board is mechanically coupled to an interior surface of the A-cover via an adhesive. In an embodiment, the adhesive may be a thermally conductive adhesive. The A-cover may be made of a thermo conductive material that conducts heat from the PMIC and out of a back surface of the A-cover and away from the OLED display layer. The PMIC may receive power from the battery to provide managed power to the first portion of the display daughter board and OLED display layer. Although the present specification may describe embodiments where an information handling system includes the video display, the present specification also contemplates that the video display may be physically separated from the information handling system with the video display being operatively coupled to the processor of the information handling system via, for example, a video cable. The present contemplates these other configurations without going beyond the scope of the principles described herein.

FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 can be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a control system, a camera, a scanner, a printer, a pager, a personal trusted device, a web appliance, or any other suitable machine capable of executing a set of instructions (sequential or otherwise) that specify actions to be taken by that machine, and can vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the information handling system 100 can be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system 100 can include one or more storage devices, one or more communications ports for communicating with external devices, as well as, various input and output (I/O) devices, such as a keyboard 114, a mouse, a video/graphic display, or any combination thereof. The information handling system 100 can also include one or more buses operable to transmit communications between the various hardware components. Portions of an information handling system 100 may themselves be considered information handling systems 100.

Information handling system 100 can include devices or modules that embody one or more of the devices or execute instructions for the one or more systems and modules described herein, and operates to perform one or more of the methods described herein. For example, the information handling system 100 may be a laptop computer, convertible laptop computer, a tablet, or other information handling system have display capabilities. The information handling system 100 may execute code instructions 124 that may operate on servers or systems, remote data centers, or on-box in individual client information handling systems according to various embodiments herein. In some embodiments, it is understood any or all portions of code instructions 124 may operate on a plurality of information handling systems 100.

The information handling system 100 also includes a GPU 103. The GPU 103 along with any display driver integrated circuit (IC) 134 is responsible for rendering graphics such as software application windows and virtual tools (e.g., virtual keyboards) on the video display 110. The GPU 103 may specifically be designed to rapidly manipulate data to accelerate the creation of images (e.g., application windows and virtual tools) in a frame buffer for output at the video display 110. During operation, the GPU 103 may provide this processed image data to the driver IC 134 at the video display 110. In an embodiment, the GPU 103 may be communicatively and directly coupled to the driver IC 134 via a communication line in order to provide data directly to the driver IC 134 for display. By doing so, the direct connection may increase the data transmission to the driver IC 134. In another embodiment, the GPU 103 may be operatively coupled to the PMIC 138 for the data to be rerouted to the driver IC 134.

The information handling system 100 may include a processor 102 such as a central processing unit (CPU), control logic or some combination of the same. Any of the processing resources may operate to execute code that is either firmware or software code. Moreover, the information handling system 100 can include memory such as main memory 104, static memory 106, computer readable medium 122 storing instructions 124, and drive unit 116 (volatile (e.g. random-access memory, etc.), nonvolatile (read-only memory, flash memory etc.) or any combination thereof). The information handling system 100 can also include one or more buses 108 operable to transmit communications between the various hardware components such as any combination of various input and output (I/O) devices.

The information handling system 100 may further include a video display 110. The video display 110 in an embodiment may function as a liquid crystal display (LCD), an organic light emitting diode (OLED), a flat panel display, or a solid-state display. As mentioned herein, the present application may be directed specifically at an OLED-type display layer or device, the present specification does contemplate that the principles described herein may be equally applicable to other types of display devices and the present specification contemplates such uses of these principles in relation to these other types of devices. Additionally, the information handling system 100 may include an input device 112, such as a cursor control device (e.g., mouse 116, touchpad, or gesture or touch screen input, and a keyboard 114. The information handling system 100 can also include a disk drive unit 118.

The information handling system 100 may further include a power management unit (PMU) 152. The PMU 152 may manage the power provided to the components of the information handling system 100 such as the processor 102, the GPU 103 and the video display 110. In an embodiment, the PMU 152 may be electrically coupled to the PMIC 138 of the second portion 136 of the display daughter board 130 via a lead 150 formed, in an embodiment, through the hinge of the information handling system. The PMU 152 may also be coupled to power connections of a power plane of the information handling system 100 to provide power to the remaining components of the information handling system. Further, PMU 152 may be coupled to bus 108 for data communications and commands relating to power management. In an embodiment, the amount of power provided to the PMIC 138 to operate may be sufficient for the PMIC 138 to operate the driver IC 134 and OLED display layer 128 of the video display 110.

The network interface device 120 can provide connectivity to a network 128, e.g., a wide area network (WAN), a local area network (LAN), wireless local area network (WLAN), a wireless personal area network (WPAN), a wireless wide area network (WWAN), or other networks. Connectivity may be via wired or wireless connection. The wireless adapter 120 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. In some aspects of the present disclosure, one wireless adapter 120 may operate two or more wireless links.

Wireless adapter 120 may connect to any combination of macro-cellular wireless connections including 2G, 2.5G, 3G, 4G, 5G or the like from one or more service providers. Utilization of radiofrequency communication bands according to several example embodiments of the present disclosure may include bands used with the WLAN standards and WWAN carriers, which may operate in both license and unlicensed spectrums.

In some embodiments, software, firmware, dedicated hardware implementations such as application specific integrated circuits, programmable logic arrays and other hardware devices can be constructed to implement one or more of some systems and methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations can include distributed processing, component/object distributed processing, and parallel processing. Alternatively, virtual computer system processing can be constructed to implement one or more of the methods or functionalities as described herein.

The present disclosure contemplates a computer-readable medium that includes instructions, parameters, and profiles 124 or receives and executes instructions, parameters, and profiles 124 responsive to a propagated signal, so that a device connected to a network 128 can communicate voice, video or data over the network 128. Further, the instructions 124 may be transmitted or received over the network 128 via the network interface device 120.

The information handling system 100 can include a set of instructions 124 that can be executed to cause the computer system to perform any one or more of the methods or computer-based functions disclosed herein. For example, instructions 124 may execute software agents or other aspects or components in order to process data and present a graphical user interface (GUI) to a user on the OLED display layer 128 of the video display 110. Various software modules comprising application instructions 124 may be coordinated by an operating system (OS), and/or via an application programming interface (API). An example operating system may include Windows®, Android®, and other OS types. Example APIs may include Win 32, Core Java API, or Android APIs.

The disk drive unit 118 may include a computer-readable medium 122 in which one or more sets of instructions 124 such as software can be embedded. Similarly, main memory 104 and static memory 106 may also contain a computer-readable medium for storage of one or more sets of instructions, parameters, or profiles 124 including an estimated training duration table. The disk drive unit 118 and static memory 106 may also contain space for data storage. Further, the instructions 124 may embody one or more of the methods or logic as described herein. For example, instructions relating to the processing of data and display of a GUI to a user at the OLED display layer 128, software algorithms, processes, and/or methods may be stored here. In a particular embodiment, the instructions, parameters, and profiles 124 may reside completely, or at least partially, within the main memory 104, the static memory 106, and/or within the disk drive 116 during execution by the processor 102 of information handling system 100. As explained, some or all of the instructions relating to the processing of data and display of a GUI to a user at the OLED display layer 128, software algorithms, processes, and/or methods may be executed locally or remotely. The main memory 104 and the processor 102 also may include computer-readable media.

Main memory 104 may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The instructions relating to the processing of data and display of a GUI to a user at the OLED display layer 128, software algorithms, processes, and/or methods may be stored in static memory 106, or the drive unit 116 on a computer-readable medium 122 such as a flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

The information handling system 100 may, in an embodiment, further includes a display daughter board 130. As described herein, the display daughter board 130 may be physically bifurcated into a first portion of the display daughter board 132 and the second portion of the display daughter board 136. In the embodiments presented herein, the PMIC 138 is mechanically and electrically supported by the second portion of the display daughter board 136 so that this heat producing element may be separated physically from the other components as well as the OLED display layer 128. The first portion of the display daughter board 132 may include any other components or elements used to drive the OLED display layer 128. In these embodiments, a first flexible flat cable (FFC) 140 may communicatively and operatively couple the second portion of the display daughter board 136 to the first portion of the display daughter board 132. Additionally, a second FFC 142 may be used to communicatively and operatively couple the first portion of the display daughter board 132 to the OLED display layer 128.

Each of the first FFC 140 and second FFC 142 may be used to supply power and electrical signals to the PMIC 138, a driver IC 134 mechanically coupled to the first portion of the display daughter board 132, other electrical components on the first portion of the display daughter board 132 and second portion of the display daughter board 136, as well as the OLED display layer 128. In an embodiment, the second portion of the display daughter board 136 may be electrically coupled to a power source so that the PMIC 138 may receive that power and be used to drive the other components such as the driver IC 134 on the first portion of the display daughter board 132. Other FFCs may be used to send any signal data to any of the electrical components placed on the first portion of the display daughter board 132 or the second portion of the display daughter board 136 so that image data may be represented on the OLED display layer 128 of the video display 110.

The bifurcation of the display daughter board 130 allows for certain electronic, heat-producing components to be mechanically supported by the second portion of the display daughter board 136 rather than the first portion of the display daughter board 132. As described herein, the second portion of the display daughter board 136 may be mechanically coupled to an A-cover 146 of a display housing 144. By doing so, the heat produced by the PMIC 138 may be placed away from the OLED display layer 128 of the video display 110 so that this heat may be directed away from the OLED display layer 128 and towards the A-cover 146. In an embodiment, the A-cover 146 may be made of a heat conductive material such as a metal that thermally conducts heat from the PMIC 138, through the A-cover 146, and out of the housing 144.

In the embodiments described herein, a form factor display housing 144 may include an "A-cover" 146 which serves as a back cover for the display housing 144 and a "B-cover" which may serve as the bezel 148 and the OLED display layer 128 of, for example, a convertible laptop information handling system. Together, in an embodiment, the A-cover 146 and B-cover that includes the bezel 148 may form an enclosure as a display chassis to house various components of the video display 110 for the information handling system 100 such as a camera and a microphone, among other components.

In an embodiment, the second portion of the display daughter board 136 with its PMIC 138 may be coupled to a back side of the OLED display layer 128. In some embodiments, the second portion of the display daughter board 136 may include structures used to distribute heat produced by the PMIC 138 across a larger surface of the back side of the OLED display layer 128. In some embodiments, the placement of the second portion of the display daughter board 136 with its PMIC 138 across the surface of the OLED display layer 128 may be selected to be away from other heat sources associated with the operation of the information handling system 100. By way of example, where the video display 110 forms part of a convertible laptop-type information handling system 100, heat from the operation of the processor 102 may be expelled out a back side of a C-cover and D-cover assembly forming a base housing rigidly coupled to the display housing. This heat from the processor 102 may cause a bottom portion of the video display 110 to also be heated as the air is being vented out this back side of the C-cover and D-cover. In this embodiment, the length of the first FFC 140 may be increased so that the second portion of the display daughter board 136 may be coupled mechanically to the back side of the OLED display layer 128 at or around an upper portion of the OLED display layer 128. This allows the heat from the PMIC 138 to be distributed across a portion of the OLED display layer 128 that is not subjected to another heat source.

In an embodiment, the PMIC 138 may communicate with the main memory 104, the processor 102, the video display 110, the alpha-numeric input device 112, and the network interface device 120 via bus 108, and several forms of communication may be used, including ACPI, SMBus, a 24 MHZ BFSK-coded transmission channel, or shared memory. Driver software, firmware, controllers and the like may communicate with applications on the information handling system 100.

In other embodiments, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a standalone device). The system, device, controller, or module can include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module can also include a combination of the foregoing examples of hardware or software. In an embodiment an information handling system 100 may include an integrated circuit or a board-level product having portions thereof that can also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another can communicate directly or indirectly through one or more intermediaries.

Figure 2:
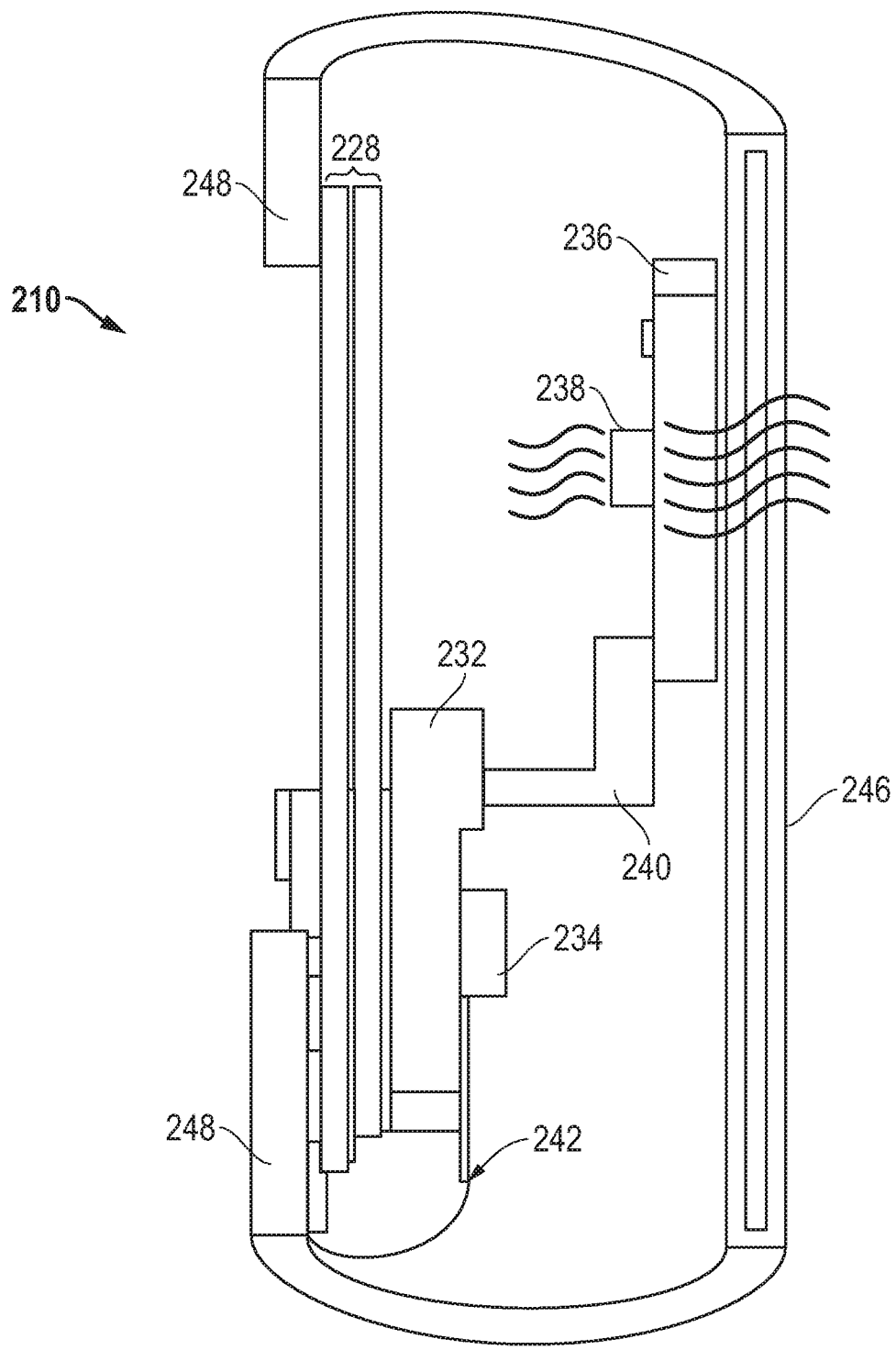
FIG. 2 is a side cross sectional view of a video display according to an embodiment of the present disclosure.

FIG. 2 is a side cross sectional view of a video display 210 according to an embodiment of the present disclosure. As described herein, the video display 210 may be a standalone device that receives input from a processor to display images on the OLED display layer 228 of the video display 210. In other embodiments, the video display 210 may form part of an information handling system such as a laptop device or convertible laptop device. In any embodiment described herein, the video display 210 may include a housing that includes a A-cover 246 and bezel 248. It is understood that the A-cover 246 and bezel 248 of the B-cover may be opratively coupled along a top, a bottom and side edges to form the display housing. The A-cover 246 and bezel 248 may serve as a display housing, along with the OLED display layer 228, for the first portion of the display daughter board 232, second portion of the display daughter board 236, first FFC 240, second FFC 242, and any other component, circuitry, or devices formed within the video display 210.

The video display 210 may include a display daughter board that has been separated into two functional and physical sections. The first portion of the display daughter board 232 may be communicatively, operatively, and immediately coupled to the OLED display layer 228. As shown in FIG. 2, the first portion of the display daughter board 232 is coupled to a back side of the OLED display layer 228 in a "bent" configuration. The bent configuration allows the back side of the first portion of the display daughter board 232 to be mechanically coupled to a back side of the OLED display layer 228. As oriented, the first portion of the display daughter board 232 may not be extended below the surface of the OLED display layer 228. This may result in a reduced width of the bezel 248 thereby increasing the usable space available to increase the size of the OLED display layer 228. Additionally, the bezel 248 may be made to be of equal length around the entire circumference of the OLED display layer 228 adding to the aesthetic appeal of the video display 210. In some embodiments, the width of the bezel 248 may be significantly reduced or even eliminated thereby increasing the size of the OLED display layer 228 even further.

The first portion of the display daughter board 232 may be communicatively coupled to the OLED display layer 228 via a second FFC 242. The second FFC 242 may be any length so that the second FFC 242 may wrap around the bottom edge of the OLED display layer 228 and connect to the components placed on the first portion of the display daughter board 232 to the OLED display layer 228. In these embodiments, the components of the first portion of the display daughter board 232 such as the driver IC 234 may be used to provide power and driving signals to the OLED display layer 228 in order to create an image on the OLED display layer 228. In the embodiments described herein, the driver IC 234 and other components formed on the first portion of the display daughter board 232 do not emit a significant amount of heat sufficient to degrade the OLED display layer 228 or create image sticking.

The display daughter board may also include the second portion of the display daughter board 236 as described herein. As described herein, the second portion of the display daughter board 236 includes a PMIC 238. The PMIC 238 may be any integrated circuit that manages the power provided to the OLED display layer 228 either directly or via the application of power to certain components maintained on the first portion of the display daughter board 232. In an embodiment, the PMIC 238 may include electrical circuitry that implements a direct current (DC) to DC conversion of power, battery charging, voltage scaling, power sequencing, or other functions used to provide managed power to the OLED display layer 228 and components on the first portion of the display daughter board 232 such as the driver IC 234.

As shown in FIG. 2, the second portion of the display daughter board 236 with its PMIC 238 is mechanically coupled to the A-cover 246 formed behind the OLED display layer 228 in an embodiment. The second portion 236 of the display daughter board may be operatively coupled to the first portion 232 of the display daughter board via the first FFC 240. In this embodiment, the back side of the second portion of the display daughter board 236 may be coupled to a front or interior side of the A-cover 246. The second portion of the display daughter board 236 may be coupled to the interior surface of the A-cover 246 via an adhesive or other mechanical fastener such as a screw. In the embodiment shown in FIG. 2, the PMIC 238 may discharge an amount of heat therefrom due to the operation of the PMIC 238 as the PMIC 238 provides power to the OLED display layer 228 and first portion of the display daughter board 232 as described herein. The heat produced by the PMIC 238 during operation, may be allowed to be conducted into any open space between the interior surface of the A-cover 246 and to the back side of the OLED display layer 228. Additionally, the heat may be conducted into the A-cover 246 due to the thermo-conductive properties of the material the A-cover 246 is made of as well as via conductive adhesive or a mechanical fastener. In an embodiment, the A-cover 246 may be made of a metal that conducts heat more readily than other types of materials such as plastics. In an embodiment, the A-cover 246 may be made of aluminum that has around 247 Watts per meter per degree Kelvin (W/m·K). Other types of metals or metal alloys that sufficiently conduct heat away from the OLED display layer 228 and out of the video display 210 so that the OLED display layer 228 is not degraded by the heat or that image sticking does not occur.

Figure 3:
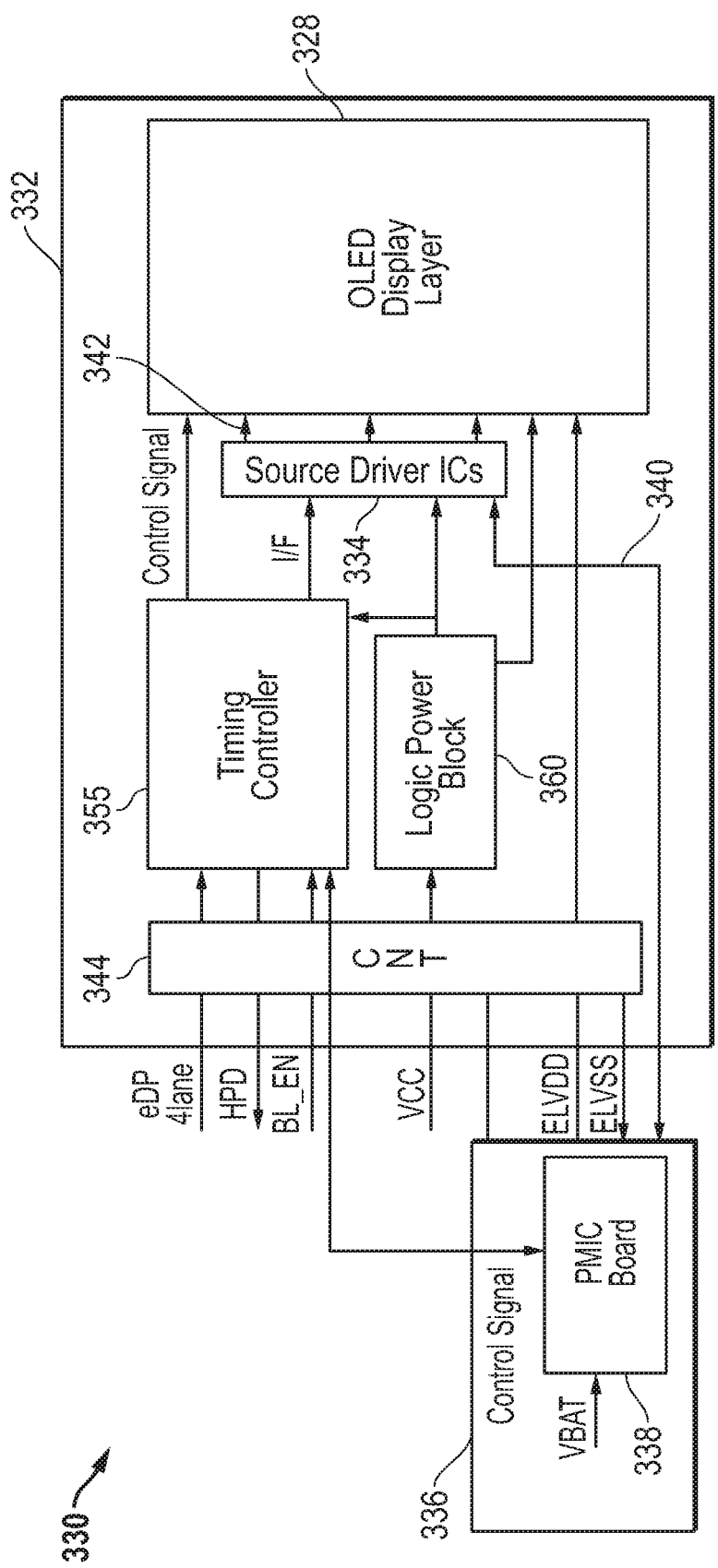
FIG. 3 is a block diagram of a bifurcated display daughter board of a video display according to an embodiment of the present disclosure.

FIG. 3 is a block diagram of a bifurcated display daughter board 330 of a video display according to an embodiment of the present disclosure. Although FIG. 3 shows a specific layout of any of the individual elements placed on the first portion of the display daughter board 332 and second portion of the display daughter board 336, the present specification contemplates that other layouts of the individual elements described herein may be implemented without going beyond the scope of the principles described herein. Additionally, the type and number of elements formed on either the first portion of the display daughter board 332 and second portion of the display daughter board 336 may include less or more of the elements represented in FIG. 3.

FIG. 3 shows the second portion of the display daughter board 336 that includes a PMIC 338. In this embodiment, the PMIC 338 may receive a voltage (VBAT) from a power source such as a battery or power transformer and PMU associated with an information handling system. As described herein, the PMIC 338 may manage this power to provide a usable current, at a specific voltage, to the other components on the first portion of the display daughter board 332. The voltage and current provided to the first portion of the display daughter board 332 from the PMIC 338 may vary depending on the type, number, and requirements of the components of the first portion of the display daughter board 332.

During operation of the PMIC 338, as described herein, the PMIC 338 may produce a significant amount of heat. This heat may degrade the operational capabilities of the OLED display layer 328 if not dissipated. In order to prevent this heat from degrading the OLED display layer 328, in some embodiments, the second portion of the display daughter board 336 with its PMIC 338 may be coupled to an A-cover as described. Especially where the A-cover is made of a heat conductive material, the heat from the PMIC 338 may be dissipated into the A-cover and expelled out from the exterior surface of the A-cover and away from the OLED display layer 328. Because the second portion of the display daughter board 336 is communicatively and operatively coupled to the first portion of the display daughter board 332 via a first FFC 340 or other electrical connection, the second portion of the display daughter board 336 may be placed at a location away from the first portion of the display daughter board 332 and the OLED display layer 328 and the length of the first FFC 340 may be adjusted to accomplish the selective placement of the second portion of the display daughter board 336 at a location where the heat may be sufficiently dissipated. In an embodiment, the first FFC 340 may operatively couple the PMIC 338 to the driver IC 334. The first FFC 340 may be any electrical cable that is flexible and flat such that the second portion of the display daughter board 336 may be placed a distance away from the first portion of the display daughter board 332 by fitting between the back surface of the OLED display layer and the interior surface of the A-cover. In an embodiment, the first FFC 340 may include connectors that connect to a serial port formed on each of the first portion of the display daughter board 332 and second portion of the display daughter board 336 to enable data and/or power communication between the second portion of the display daughter board 336 and first portion of the display daughter board 332.

The CNT 344 may be any type of connector that operatively couples the first portion of the display daughter board 332 to the second portion of the display daughter board 336. For example CNT 344 may be data ribbon cable connector with power or data connectivity. Additionally, the CNT 344 may operatively couple the first portion of the display daughter board 332 to other components within the information handling system such as a power source, a GPU, processor, or other component. In a specific embodiment, the CNT 344 may communicatively couple a GPU of the information handling system to the timing controller 355 to present a control signal to the OLED display layer 328 as well as an interfacing (I/F) signal to a driver IC 334 that includes source drivers for the driver IC 334.

The driver IC 334 may be communicatively coupled to the OLED display layer 328 via a second FFC 342. Similar to the first FFC 340, the second FFC 342 may be any electrical cable that is flexible and flat such that the OLED display layer 328 may receive image data to be displayed by the OLED display layer 328. In an embodiment, the length of the second FFC 342 may be optimized to limit the duration of transmission of the data from the driver IC 334 to the OLED display layer 328.

The first portion of the display daughter board 332 may include those components that allow for the power received from the PMIC 338 as well as image data to be used to present an image to the user at the OLED display layer 328. In an embodiment, the first portion of the display daughter board 332 may include a connector that may receive an input signal from an external processor (e.g., processor 102 in FIG. 1 as a CPU or GPU) and transmit the input signal to the timing controller 355. The timing controller 355 may include an embedded data driver that facilitates this process. For example, an input signal (e.g., on an eDP 4lane) may be received at the timing controller 355 to present to a control signal to the OLED display layer 328 as well as an interfacing (I/F) signal to a driver IC 334 that includes source drivers for the driver IC 334. A logic power block 360 may also be included to receive a collector supply voltage (Vcc) and provide power to operate the logic gates used to create the scan and data signals to the OLED display layer 328.

Figure 4:
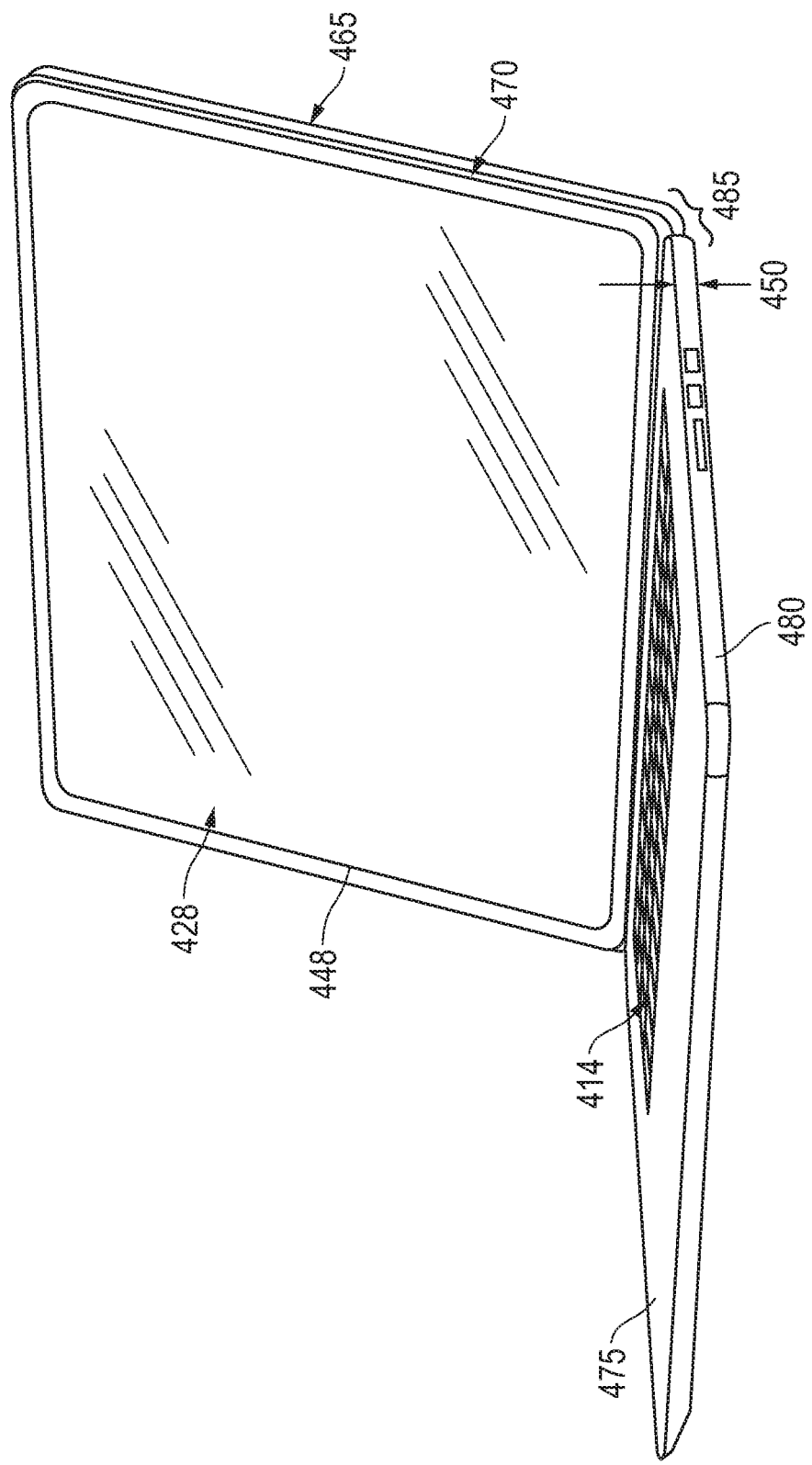
FIG. 4 is a block diagram of a video display according to an embodiment of the present disclosure.

FIG. 4 is a block diagram of a video display according to an embodiment of the present disclosure. FIG. 4 shows that the OLED display layer 428 may be bordered by a bezel 448. According to the embodiments described herein, because the first portion of the display daughter board is placed behind the OLED display layer 428 in a bent-type orientation, the width 450 of the bezel 448 at the bottom of the OLED display layer 428 may be reduced. In this embodiment, the width 450 of the bezel 448 at the bottom of the OLED display layer 428 may be equal to the widths of the bezel 448 at the sides and top of the OLED display layer 428. In some embodiments, because the first portion of the display daughter board is placed behind the OLED display layer 428 in a bent-type orientation, the bezel 448 may be significantly reduced or even eliminated in order to increase the size of the OLED display layer 428.

In a specific embodiment, the information handling system is described herein as being a laptop or dual display screen notebook-type computing device that includes the OLED display layer 428 or more than on OLED display layers (not shown). These types of information handling systems may include one or more chassis housings (e.g., a metal chassis) that may be used to encase the components of the information handling system including one or more display housings to house the OLED display layer 428 or layers. For example, the display housing chassis may include an A-cover 465 functioning to enclose a portion of the display daughter board (not shown) of the information handling system as well as other components associated with the OLED display layer 428. In this embodiment, the display housing chassis may further include a B-cover 470 functioning to enclose, among other components, the OLED display layer 428 with the A-cover 465. Here, the A-cover 465 and the B-cover 470 may be joined together in an embodiment to form a fully enclosed display housing lid chassis of the notebook-type information handling system. In this embodiment, the chassis may further include a C-cover 475 housing a keyboard 414, touchpad, among other components which may serve as a base housing portion of the chassis as shown or may comprise a second display housing in some embodiments (not shown). The chassis may also include a D cover 480 base housing for the notebook-type information handling system 400. The C cover 475 and the D cover 480 may be joined together to form a fully enclosed base housing chassis. The base housing chassis in some embodiments described herein may be coupled together via a hinge 485 operably connecting the lid chassis (e.g., the A-cover 465 and B-cover 470 assembly) with the base chassis (e.g., C-cover 475 and the D-cover 480 assembly) so as to place the base chassis of the notebook-type information handling system 400 in a plurality of configurations with respect to the digital display enclosed within the lid chassis. Although the information handling system may be described as being a notebook-type information handling system, the OLED display layer 428 may be incorporated into any other type of information handling system or display device including an external and communicatively coupled monitor for a desktop computing device, a dual-display or multiple display information handling system, a tablet-type information handling system, a convertible laptop, among others.

Figure 5:
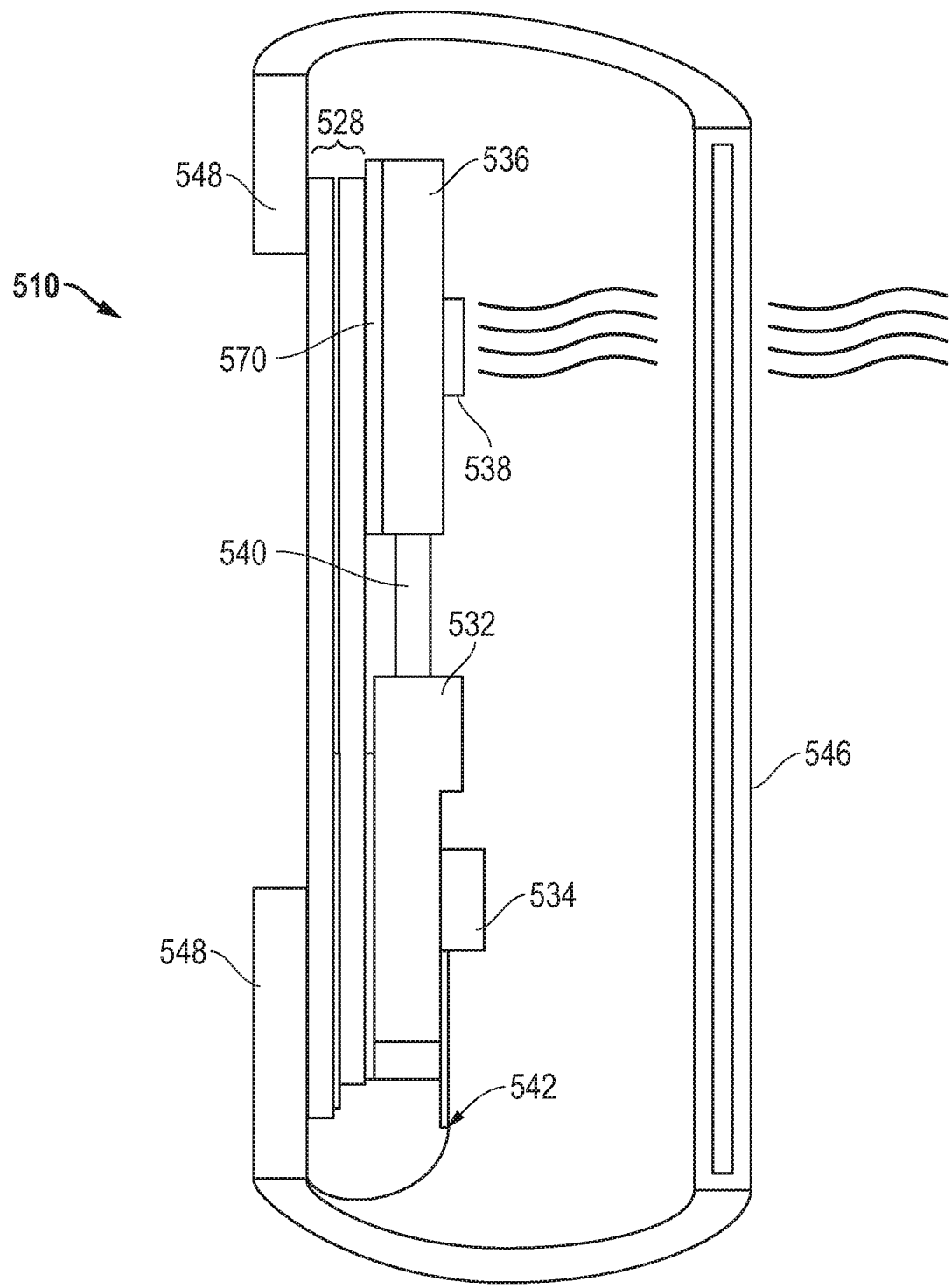
FIG. 5 is a side cross sectional view of a video display according to another embodiment of the present disclosure.

FIG. 5 is a side cross sectional view of a video display 510 according to another embodiment of the present disclosure. As described herein, the video display 510 may be a standalone device that receives input from a processor to display images on the OLED display layer 528 of the video display 510. In other embodiments, the video display 510 may form part of an information handling system such as a laptop device, convertible laptop device, dual-display device, or other information handling system. In any embodiment described herein, the video display 510 may include a housing that includes a A-cover 546 and bezel 548. The A-cover 546 and bezel 548 may serve as a housing for the OLED display layer 128, the first portion of the display daughter board 532, second portion of the display daughter board 536, first FFC 540, second FFC 542, and any other component, circuitry, or devices formed within the video display 510. It is understood that the A-cover 546 and bezel 548 may be closed at the top and bottom of the video display 510 and side edges.

The video display 510 may include a display daughter board that has been separated into two functional and physical sections. The first portion of the display daughter board 532 may be communicatively and operatively coupled to the OLED display layer 528 along a bottom section of the display housing. As shown in FIG. 5, the first portion of the display daughter board 532 is coupled to a back side of the OLED display layer 528 in a "bent" configuration. The bent configuration allows the back side of the first portion of the display daughter board 532 to be mechanically coupled to a back side of the OLED display layer 528. As oriented, the first portion of the display daughter board 532 may not be extended below the surface of the OLED display layer 528.

This extension of the first portion of the daughter board 532 may allow signal devices to drive graphics signals to the bottom of the OLED display layer 528. This may result in a reduced width of the bezel 548 thereby increasing the usable space available to increase the size of the OLED display layer 528. Additionally, the bezel 548 may be made to be of equal length around the entire circumference of the OLED display layer 528 adding to the aesthetic appeal of the video display 510. In some embodiments, the width of the bezel 548 may be significantly reduced or even eliminated thereby increasing the size of the OLED display layer 528 even further.

The first portion of the display daughter board 532 may be communicatively coupled to the OLED display layer 528 via a second FFC 542. The second FFC 542 may be any length so that the second FFC 542 may wrap around the bottom edge of the OLED display layer 528 and connect to the components placed on the first portion of the display daughter board 532 to the OLED display layer 528. In the shown orientation, the length of the second FFC 542 may be optimized to be short such that the graphics signals transferred to the OLED 528 may be as fast as possible. In these embodiments, the components of the first portion of the display daughter board 532 such as the driver IC 534 may be used to provide power and driving signals to the OLED display layer 528 in order to create an image on the OLED display layer 528. In the embodiments described herein, the driver IC 534 and other components formed on the first portion of the display daughter board 532 do not emit a significant amount of heat sufficient to degrade the OLED display layer 528 or create image sticking.

The display daughter board may also include the second portion of the display daughter board 536 as described herein. As described herein, the second portion of the display daughter board 536 includes a PMIC 538. The PMIC 538 may be any integrated circuit that manages the power provided to the OLED display layer 528 either directly or via the application of power to certain components maintained on the first portion of the display daughter board 532. In an embodiment, the PMIC 538 may include electrical circuitry that implements a direct current (DC) to DC conversion of power, battery charging, voltage scaling, power sequencing, or other functions used to provide managed power to the OLED display layer 528 and components on the first portion of the display daughter board 532 such as the driver IC 534. Power may be received from a power source of the information handling system such as a battery, power transformers, power management unit, or the like. Such components may be placed in the base chassis. Power may be received at the PMIC 138 in some embodiments.

As shown in FIG. 5, the second portion of the display daughter board 536 with its PMIC 538 is mechanically coupled to the back side of the OLED display layer 528. In this embodiment, the back side of the second portion of the display daughter board 536 may be coupled to the back side of the OLED display layer 528 via an adhesive or other type of fastening device at an upper orientation away from the bottom bezel and hinge location which may be subject to higher heat levels. Along with the distance of the second portion of the display daughter board 536 away from the higher heat levels, the second portion of the display daughter board 536 may include an insulative layer 570 to protect the OLED display layer 528 from receiving heat from the operation of the PMIC 538. In an embodiment, the insulative layer 570 may be made of a polymer such as a plastic. In an embodiment, the insulative layer 570 may be a double sided tape that prevents some or all of the heat from the PMIC 538 from passing to the OLED display layer 528. The double sided tape may work to adhere elements as well in some embodiments. In the embodiment shown in FIG. 5, an A-cover 546 may be placed behind the OLED display layer 528, the first portion of the display daughter board 532, and the second portion of the display daughter board 536.

In the embodiment shown in FIG. 5, the PMIC 538 may discharge an amount of heat therefrom due to the operation of the PMIC 538 as the PMIC 538 provides power to the OLED display layer 528 and first portion of the display daughter board 532 as described herein. The heat produced by the PMIC 538 during operation, may be allowed to be conducted into any open space between the interior surface of the A-cover 546 and the back side of the OLED display layer 528 away from the hinge and base chassis heat exhaust vent and any other sources of heat produced during the operation of the information handling system. In an embodiment, some layers of the second portion of the display daughter board 536 may be made of an insulative material so that heat from the PMIC 538 does not pass through the second portion of the display daughter board 536 and into the OLED display layer 528. In an embodiment, the A-cover 546 may serve as a heat sink due to the thermally conductive nature of the material of the A-cover 546. The A-cover 546 may be made of a metal that conducts heat more readily than other types of materials such as plastics. In an embodiment, the A-cover 546 may be made of aluminum that has around 247 Watts per meter per degree Kelvin (W/m·K). Other types of metals or metal alloys that sufficiently conduct heat away from the OLED display layer 528 and out of the video display 510 so that the OLED display layer 528 is not degraded by the heat or that image sticking does not occur.

FIG. 6 is a flow diagram illustrating a method 600 of manufacturing a video display according to an embodiment of the present disclosure. The method 600 may begin at block 605 with forming an OLED display layer. As described herein, the OLED layer may be relatively susceptible to heat produced by heat generating elements within the video display such as a PMIC. Although the present specification describes the video display as having an OLED display layer, the present specification contemplates that any type of video display technology may be used. The embodiments of the present disclosure may be used where application of heat to any type of video display technologies degrades the operation of the video display.

The method 600 may continue with, at block 610, forming a first portion of a display daughter board. As described herein, the first portion of the display daughter board may include a driver IC that, at block 615, is mechanically and electrically coupled to certain electrical leads formed on and through the first portion of the display daughter board. The first portion of the daughter board may be a printed circuit board with electrically conductive traces and mounting locations for one or more integrated circuits, connectors, and other functional components.

The method 600 may include forming a second portion of a display daughter board at block 620. The first portion of the display daughter board and second portion of the display daughter board may, in an embodiment, be formed by cutting a single display daughter board (e.g., PCB) into two sections, placing electrical leads on and through the bifurcated boards and adding the circuitry to the surface of the first and second portions of the display daughter boards described herein. In other embodiments, the first and second portions of the display daughter board may be formed on two distinct printed circuit boards. In the present specification, the bifurcation of the first portion of the display daughter board from the second portion of the display daughter board may be either a physical bifurcation of the display daughter board or a functional bifurcation of the display daughter board, or both. Therefore, for purposes of the present specification a bifurcation of a display daughter board may, at least, result in the physical relocation of some components of a display daughter board to a separate and distinct PCB substrate.

The method 600 may include, at block 625, with mechanically coupling a PMIC to the second portion of the display daughter board. The second portion of the daughter board may be a printed circuit board with electrically conductive traces and mounting locations for one or more integrated circuits, connectors, and other functional components. The mechanical coupling may further include electrically coupling the PMIC to any number of electrical traces formed on or within the second portion of the display daughter board.

The method 600 may further include operatively coupling the first portion of the display daughter board to the second portion of the display daughter board via a first FFC at block 630. As described herein, the first FFC may allow for signals and electrical power to be transmitted between the first portion of the display daughter board and the second portion of the display daughter board. Although the present specification describes the use of an FFC between the first portion of the display daughter board and the second portion of the display daughter board, the present specification contemplates that any type of cabling may be used.

The method 600 may continue with operatively coupling the first portion of the display daughter board to the OLED display layer at block 635. As described herein, the first FFC may allow for signals and electrical power to be transmitted between the first portion of the display daughter board and the OLED display layer. Although the present specification describes the use of an FFC between the first portion of the display daughter board and the OLED display layer, the present specification contemplates that any type of cabling may be used.

The method 600 may continue with mechanically coupling a bezel around the OLED display layer at block 640. The bezel may be coupled to the OLED display layer 128 using any fastening device including an adhesive or screws. In an embodiment, the bezel 148 may be coupled to the OLED display layer 128 via coupling the bezel 148 to an A-cover or other portion of a housing of the housing of the video display.

The method 600 may, at block 645, include mechanically coupling the first portion of the of the daughter board to the OLED display layer and the second portion of the daughter board to an A-cover. As described herein, the second portion of the daughter board is coupled to an A-cover in one embodiment to prevent heat from the PMIC from damaging the OLED display device. In another embodiment, the second portion of the daughter board may be mechanically coupled to a back side of the OLED display layer and may further include the coupling of an insulative layer between the second portion of the daughter board and the OLED display layer. The insulative layer and second portion of the daughter board may be coupled to the back side of the OLED display layer using any type of adhesive or mechanical fastener. In this embodiment, the second portion of the daughter board may be physically coupled to the OLED display layer a distance away from the hinge and any heat exhaust vent such that the heat from these sources is not added to the heat produced by the PMIC. In an example embodiment, the second portion of the daughter board may be physically coupled to the OLED display layer above the first portion of the daughter board within the display housing for example. In this way, the first portion of the daughter board with data connectivity to the OLED display layer remains close to driver connection points along the bottom of the OLED layer while the PMIC and other power management aspects which may generate heat may be displaced away from heat sources and allow for improved heat dissipation.

The method 600, at block 650, may include forming a motherboard, memory, power system, graphics processor, connectors, cooling systems, and network interface systems in a base chassis and coupling the base chassis to the display chassis via a hinge. As described herein, the information handling system may be a notebook or laptop-type information handling system or a dual-display information handling system that allows for the convertibility of the information handling system as described herein. The method 600 includes operatively coupling, at block 655, the power system to the PMIC of the second portion of the display daughter board. In this embodiment, a lead may be used to connect the power system to the PMIC of the second portion of the display daughter board via the hinge that couples the base housing to the display housing as described herein. The base housing may include a PMU, A/C power source or battery power source to provide power via a power lead to the second portion of the display daughter board.

The method 600 may, at block 660, includes operatively coupling the graphics processor to the driver IC of the first portion of the display daughter board. Again, a data connection lead, such as an FFC, may be used to communicatively couple the driver IC of the first portion of the display daughter board to the GPU. In some embodiments, this graphics data connection to the GPU may be routed through the second portion of the display daughter board from the GPU. In this embodiment, one or more FFCs are used to connect the power system to the PMIC of the second portion of the display daughter board via the hinge and the data from the GPU. Such an FFC in an example embodiment may couple the base housing to the display housing as described herein. In other embodiments, the graphics data line may bypass the second portion of the display daughter board and couple the GPU to the first portion of the display daughter board via the hinge. In this embodiment, the FFC or other line may be used to connect the GPU to the driver IC of the first portion of the display daughter board via the hinge that couples the base housing to the display housing as described herein. In either embodiments, the FFC or other lines operatively coupling to the driver IC of the first portion of the daughter board may be used to transmit graphics signals and graphics data from the GPU for display via the OLED layer.

The method 600, at block 665, may also include mechanically coupling an A-cover to the bezel behind the OLED display layer. In this embodiment, the A-cover may be coupled to the bezel via any fastener. In a specific embodiment, the A-cover may be coupled to the bezel using a number of interfacing locking mechanisms.

The blocks of the flow diagrams of FIG. 6 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. An information handling system, comprising:
   an organic light-emitting diode (OLED) display layer of a video display to display an image to a user;
   an A-cover forming a housing behind the OLED display layer; and
   a physically bifurcated display daughter board between the OLED display layer and the A-cover, the physically bifurcated display daughter board including:
      a first portion of the display daughter board including a source driver integrated circuit (IC) operatively coupled to a processor to receive graphics data; and
      a second portion of the display daughter board comprising a power management integrated circuit (PMIC) operatively coupled to the first portion of the display daughter board and a power source,
   where the second portion of the display daughter board is mechanically coupled to an interior surface of the A-cover to dissipate heat away from the OLED display layer.

2. The information handling system of claim 1, wherein the first portion of the display daughter board is mechanically coupled to a back surface of the OLED display layer.

3. The information handling system of claim 1, wherein the first portion of the display daughter board and the second portion of the display daughter board are electrically and communicatively coupled via a flexible flat cable (FFC).

4. The information handling system of claim 1, further comprising a bezel cover formed around the OLED display layer as part of a B-cover of the video display, the bezel comprising a four-sided narrow border around the edges of the OLED display layer.

5. The information handling system of claim 1, wherein the first portion of the display daughter board is electrically coupled to the OLED display layer via a flexible flat cable (FFC) in a bent-type configuration.

6. The information handling system of claim 1, wherein the A-cover is made of a thermo conductive material that conducts heat from the PMIC and out of a back surface of the A-cover and away from the OLED display layer.

7. The information handling system of claim 1, wherein the PMIC receives power from the power source that is a battery to provide managed power to the first portion of the display daughter board and OLED display layer.

8. The information handling system of claim 1, wherein the second portion of the display daughter board is mechanically coupled to an interior surface of the A-cover via a thermally conductive adhesive.

9. An information handling system, comprising:
   a processor;
   a memory;
   a video display including an organic light-emitting diode (OLED) display layer to display an image to a user;
   an A-cover forming a display housing behind the OLED display layer; and
   a physically bifurcated display daughter board between the OLED display layer and the A-cover, the physically bifurcated display daughter board including:
      a first portion of the display daughter board operatively coupled to a back surface of the OLED display layer via a first flexible flat cable (FFC) in a bent-type configuration, the first portion of the display daughter board including a source driver integrated circuit (IC) operatively coupled to a processor to receive graphics data; and
      a second portion of the display daughter board comprising a power management integrated circuit (PMIC), the second portion of the display daughter board being operatively coupled to the first portion and a power source, where
   the second portion of the display daughter board is mechanically coupled to an interior surface of the A-cover to dissipate heat away from the OLED display layer.

10. The information handling system of claim 9, wherein the processor, memory, and power source are disposed in a base chassis operatively and electrically coupled to the display housing via a hinge including power and communication lines.

11. The information handling system of claim 9, wherein the first portion of the display daughter board and the second portion of the display daughter board are electrically and communicatively coupled via a second FFC.

12. The information handling system of claim 9, wherein the A-cover is made of a thermo conductive material that conducts heat from the PMIC and out of a back surface of the A-cover and away from the OLED display layer.

13. The information handling system of claim 9, wherein the PMIC receives power from the power source to provide managed power to the first portion of the display daughter board and the OLED display layer.

14. The information handling system of claim 9, wherein the second portion of the display daughter board is mechanically coupled to an interior surface of the A-cover via an adhesive and disposed above the first portion of the display daughter board in the display housing.

15. The information handling system of claim 9, further comprising a bezel cover formed around the OLED display layer as part of a B-cover of the video display, the bezel comprising a four-sided narrow border of equal width around the edges of the OLED display layer.

16. An information handling system, comprising:
    an organic light-emitting diode (OLED) display layer to display an image to a user;

a physically bifurcated display daughter board between the OLED display layer and the A-cover, the physically bifurcated display daughter board including:
- a first portion of the display daughter board including a source driver integrated circuit (IC) operatively coupled to a processor to receive graphics data; and
- a second portion of the display daughter board comprising a power management integrated circuit (PMIC) operatively coupled to the first portion of the display daughter board and a power source, where the second portion of the display daughter board is mechanically coupled to a back surface of the OLED display layer disposed above the first portion of the daughter board in a display housing to dissipate heat created by the PMIC apart from the first portion of the display daughter board.

17. The video display of claim 16, wherein the first portion of the display daughter board is mechanically coupled to a back surface of the OLED display layer.

18. The video display of claim 16, wherein the first portion of the display daughter board and the second portion of the display daughter board are electrically and communicatively coupled via a flexible flat cable (FFC).

19. The video display of claim 16, further comprising a bezel cover formed around the OLED display layer as part of a B-cover of the video display, the bezel comprising a four-sided narrow border of equal width around the edges of the OLED display layer.

20. The video display of claim 16, wherein the second portion of the display daughter board is mechanically coupled to the OLED display layer via a thermal insulator layer to reduce application of heat from the PMIC to the OLED layer.

* * * * *